(12) United States Patent
Seymour

(10) Patent No.: US 6,967,531 B1
(45) Date of Patent: Nov. 22, 2005

(54) MULTI-OUTPUT AMPLIFIER WITH ISOLATION BETWEEN OUTPUTS

(75) Inventor: David J. Seymour, Plano, TX (US)

(73) Assignee: Sirenza Microdevices, Inc., Broomfield, CO (US)

(*) Notice: Subject to any disclaimer, the term of this patent is extended or adjusted under 35 U.S.C. 154(b) by 98 days.

(21) Appl. No.: 10/378,233

(22) Filed: Feb. 28, 2003

(51) Int. Cl.[7] ............................................... H03F 3/00
(52) U.S. Cl. ........................................ 330/148; 330/311
(58) Field of Search ................................. 330/148, 295, 330/310, 311, 150, 124 R, 126

(56) References Cited

U.S. PATENT DOCUMENTS 3,209,164 A * 9/1965 Witt, Jr. ........................ 330/250
4,604,589 A * 8/1986 McGann ...................... 455/63.1
6,297,694 B1 * 10/2001 Yamamoto .................... 330/51
6,448,859 B2 * 9/2002 Morizuka ..................... 330/295

* cited by examiner

Primary Examiner—Henry Choe
(74) Attorney, Agent, or Firm—Christopher P. Maiorana, PC

(57) ABSTRACT

An apparatus comprising a first circuit and a second circuit. The first circuit may be configured to generate an intermediate signal in response to an input signal. The second circuit may be configured to generate a plurality of output signals in response to the intermediate signal. Each of the output signals may be (i) an amplified versions of the input signal and (ii) isolated between each of the other output signals.

15 Claims, 2 Drawing Sheets

MULTI-OUTPUT AMPLIFIER WITH ISOLATION BETWEEN OUTPUTS

FIELD OF THE INVENTION

The present invention relates to a method and/or architecture for implementing amplifiers generally and, more particularly, to a multi-output amplifier with isolation between outputs.

BACKGROUND OF THE INVENTION

The wireless market is increasing the demands of the radio frequency (RF) components used to achieve higher performance levels. Amplifiers with higher complexity and performance are needed as more bandwidth and more channels are being used. Conventional approaches use multiple paths and multiple amplifiers to achieve high isolation between ports. This results in circuits of high complexity, cost and size.

It would be desirable to replace conventional approaches that use numerous integrated circuits and discrete circuits to achieve multiport operation with a single, low cost, high performance integrated circuit configured as a multi-output amplifier with isolation between outputs.

SUMMARY OF THE INVENTION

The present invention concerns an apparatus comprising a first circuit and a second circuit. The first circuit may be configured to generate an intermediate signal in response to an input signal. The second circuit may be configured to generate a plurality of output signals in response to the intermediate signal. Each of the output signals may be (i) an amplified version of the input signal and (ii) isolated between each of the other output signals.

The objects, features and advantages of the present invention include providing an amplifier having a plurality of outputs that may (i) provide isolation between outputs (ii) implement an input emitter follower stage to provide low output impedance to a second stage, (iii) attenuate feedback between outputs, (iv) maintain a forward signal gain, (v) minimize the feedback capacitance, (vi) increase reverse isolation, and/or (vii) use on-chip and/or external resistors to set gain and output impedance.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
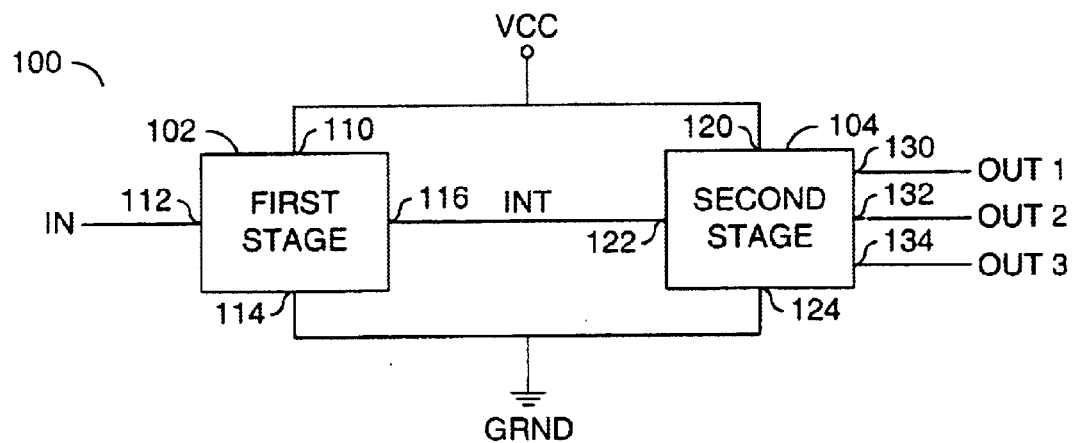
FIG. 1 is a block diagram illustrating a preferred embodiment of the present invention.

Referring to FIG. 1, a block diagram of a circuit 100 is shown in accordance with the preferred embodiment of the present invention. The circuit 100 generally comprises a stage 102 (e.g., a first stage) and a stage 104 (e.g., a second stage). The stage 102 may have an input/output 110 that may receive a supply voltage (e.g., VCC), an input 112 that may receive an input signal (e.g., IN), an input/output 114 that may be connected to a ground potential (e.g., GRND), and an output 116 that may present a signal (e.g., INT). The signal IN may be a data signal or other signal that needs to be amplified.

The stage 104 may have an input/output 120 that may receive the supply voltage VCC, an input 122 that may receive the signal INT, and an input/output 124 that may be connected to the ground potential GRND. The stage 104 may also have an output 130 that may present a signal (e.g., OUT1), an output 132 that may present a signal (e.g., OUT2), and an output 134 that may present a signal (e.g., OUT3).

The stage 102 may include an emitter follower (to be described in more detail in connection with FIG. 3). The emitter follower may be implemented to allow the stage 102 to have a high input impedance. In particular, the stage 102 does not generally introduce a drop in voltage on the signal IN. The stage 102 generally has a low output impedance to provide a buffer between the input 112 and the stage 104. In a preferred implementation, the stage 102 is implemented as a low noise design.

Figure 2:
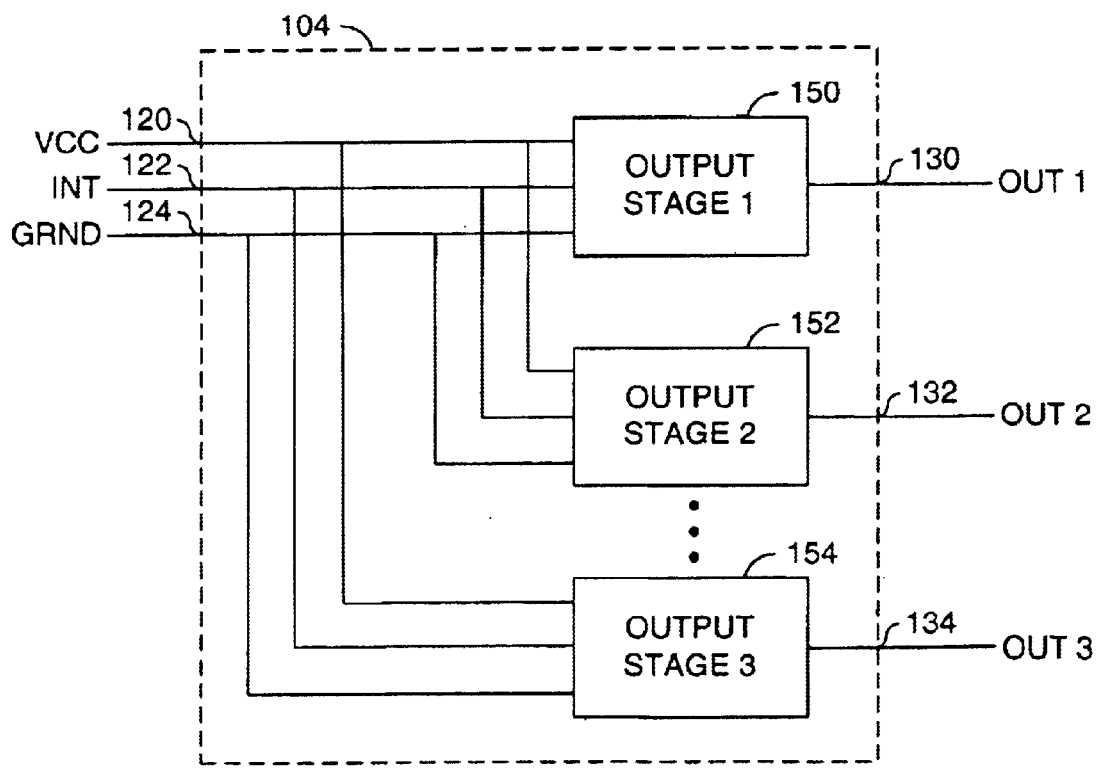
FIG. 2 is a more detailed block diagram illustrating a portion of the circuit of FIG. 1.

Referring to FIG. 2, a more detailed diagram of the stage 104 is shown. The stage 104 generally comprises a circuit 150, a circuit 152 and a circuit 154. The circuit 150, the circuit 152, and the circuit 154 may each receive the supply voltage VCC, the signal INT and the ground potential GRND. The circuit 150 may present the signal OUT1. The circuit 152 may present the signal OUT2. The circuit 154 may present the signal OUT3. The circuit 150, the circuit 152 and the circuit 154 may each be implemented as output stages. While three output stages 150, 152 and 154 are shown and described, the particular number of output stages may be varied to meet the design criteria of a particular implementation. The amplifier output stages 150, 152, and 154 may provide highly isolated amplified output signals OUT1, OUT2 and OUT3. In one example, each of the signals OUT1, OUT2 and OUT3 generally provide the same amount of amplification. However, if needed, one or more of the signals OUT1, OUT2 and OUT3 may be implemented with a higher gain.

Figure 3:
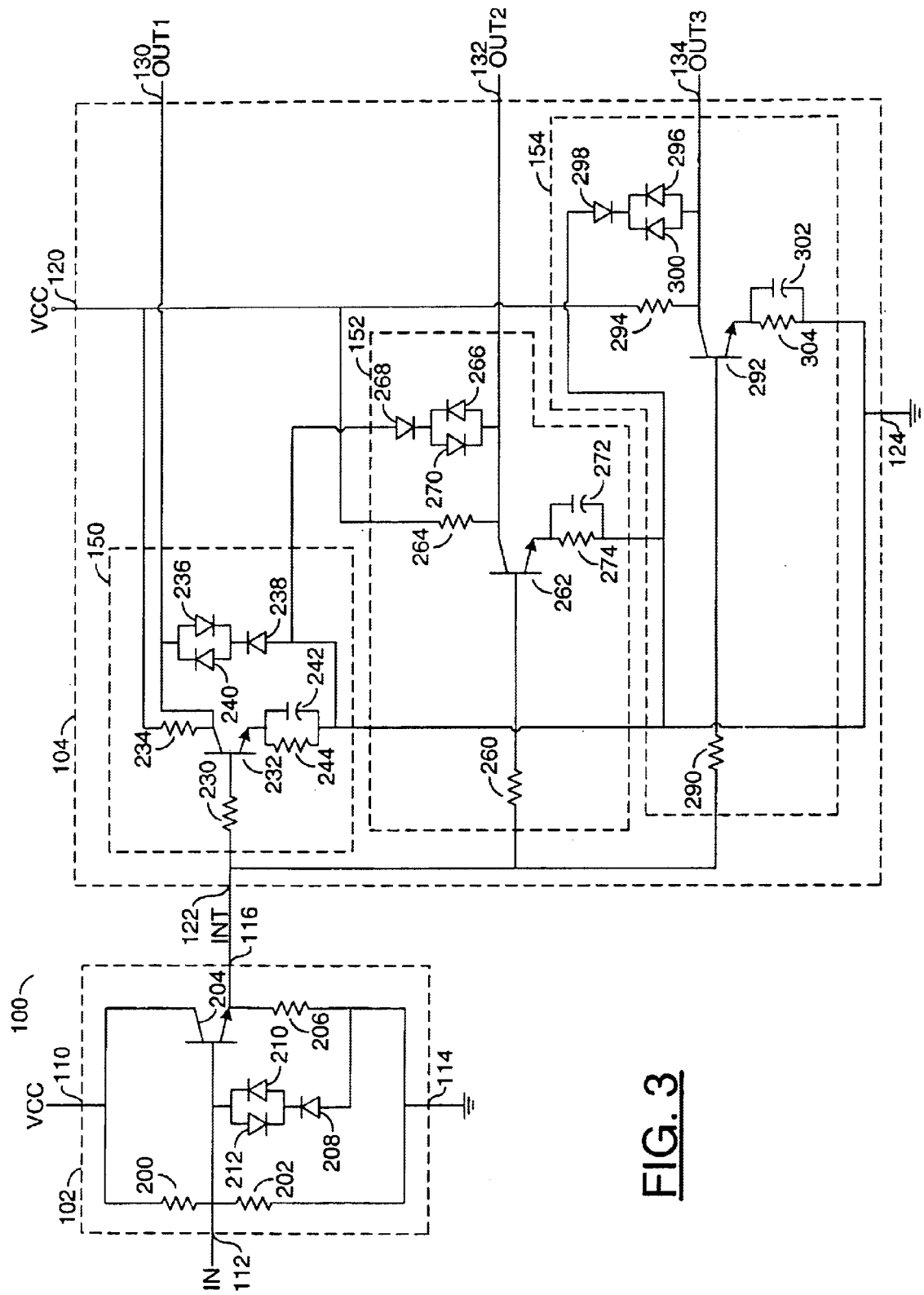
FIG. 3 is a more detailed diagram of the circuit of FIG. 1.

Referring to FIG. 3, a more detailed diagram of the circuit 100 is shown. The stage 102 may be implemented as an amplifier input stage. The stage 104 may be implemented as a multi-stage output stage.

The stage 102 generally comprises a resistor 200, a resistor 202, a transistor 204, a resistor 206, a diode 208, a diode 210, and a diode 212. The supply voltage VCC may be routed through the resistor 200 and the resistor 202 to the ground potential GRND. The supply voltage VCC may also be presented to a collector of the transistor 204. The supply voltage VCC may be a DC supply voltage configured to bias the transistor 204. The transistor 204 may have an emitter follower configuration. In particular, a base of the transistor 204 may be connected to the resistor 200 and the resistor 202. The signal IN may also be presented to the base of the transistor 204. An emitter of the transistor 204 may present the signal INT to the output 116. The resistor 206 may connect the emitter of the transistor 204 to the ground potential GRND.

The diodes 208, 210, and 212 may be arranged with the diode 208 in series with the diodes 210 and 212. The diodes 210 and 212 may be arranged in parallel. The diodes 208, 210, and 212 may be configured to connect the base of the transistor 204 with the ground potential GRND. In one example, the transistor 204 may be implemented as a bipolar junction transistor (BJT). However, other types of transistors may be implemented to meet the design criteria of a particular implementation. In general, the transistor 204 is configured as an emitter follower. Such an emitter follower configuration may provide an inherently low output impedance to the stage 104. While a BJT transistor, resistor, and diodes have been described, other circuit components may be used to meet the design criteria of a particular application.

The circuit 150 generally comprises a resistor 230, a transistor 232, a resistor 234, a diode 236, a diode 238, a diode 240, a capacitor 242, and a resistor 244. The resistor 230 may receive the signal INT. The resistor 230 may also be connected to a base of the transistor 232. The resistor 230 may be configured to adjust a level of the signal INT presented to the base of the transistor 232. The resistor 230 generally provides impedance matching between the first stage 102 and the second stage 104. A collector of the transistor 232 may be connected to the resistor 234. The resistor 234 may receive the supply voltage VCC from the input 120. The resistor 234 may be configured to bias the transistor 232. The collector of the transistor 232 may present the signal OUT1. The collector of the transistor 232 may also be connected to the ground potential GRND through the diode 236, the diode 238, and the diode 240. The diode 238 may be connected in series with the diodes 236 and 240. The diodes 236 and 240 may be connected in parallel. The diode 236, the diode 238, and the diode 240 may be configured to provide a feedback path to the collector of the transistor 232 from the ground potential GRND. An emitter of the transistor 232 may be connected to the capacitor 242 and the resistor 244. The capacitor 242 and the resistor 244 may also be connected to the ground potential GRND. In one example, the transistor 232 may be implemented as a bipolar junction transistor (BJT). While a BJT transistor, resistors, diodes, and a capacitor are mentioned, other circuit components may be chosen to meet the design criteria of a particular application.

The circuit 152 generally comprises a resistor 260, a transistor 262, a resistor 264, a diode 266, a diode 268, a diode 270, a capacitor 272, and a resistor 274. The resistor 260 may receive the signal INT. The resistor 260 may also be connected to a base of the transistor 262. The resistor 260 may be configured to adjust a level of the signal INT presented to the base of the transistor 262 and provide impedance matching between the stage 102 and the stage 104. A collector of the transistor 262 may be connected to the resistor 264. The resistor 264 may receive the supply voltage VCC from the input 120. The resistor 264 may be configured to bias the transistor 262. The collector of the transistor 262 may present the signal OUT2. The collector of the transistor 262 may also be connected to the ground potential GRND through the diode 266, the diode 268, and the diode 270. The diode 268 may be connected in series with the diodes 266 and 270. The diodes 266 and 270 may be connected in parallel. The diode 266, the diode 268, and the diode 270 may be configured to provide a feedback path to the collector of the transistor 262 from the ground potential 124. An emitter of the transistor 262 may be connected to the capacitor 272 and the resistor 274. The capacitor 272 and the resistor 274 may also be connected to the ground potential GRND. The transistor 262 may be implemented as a bipolar junction transistor (BJT). While a BJT transistor, resistors, diodes, and a capacitor are mentioned, other circuit components may be chosen to meet the design criteria of a particular application.

The circuit 154 generally comprises a resistor 290, a transistor 292, a resistor 294, a diode 296, a diode 298, a diode 300, a capacitor 302, and a resistor 304. The resistor 290 may receive the signal INT. The resistor 290 may also be connected to a base of the transistor 292. The resistor 290 may be configured to adjust a level of the signal INT presented to the base of the transistor 292 and provide impedance matching between the stage 102 and the stage 104. A collector of the transistor 292 may be connected to the resistor 294. The resistor 294 may receive the supply voltage VCC. The resistor 294 may be configured to bias the transistor 292. The collector of the transistor 292 may present the signal OUT3. The collector of the transistor 292 may also be connected to the ground potential GRND through the diode 296, the diode 298, and the diode 300. The diode 298 may be connected in series with the diodes 296 and 300. The diodes 296 and 300 may be connected in parallel. The diode 296, the diode 298, and the diode 300 may be configured to provide a feedback path to the collector of the transistor 292 from the ground potential 124. An emitter of the transistor 292 may be connected to the capacitor 302 and the resistor 304. The capacitor 302 and the resistor 304 may also be connected to the ground potential GRND. The transistor 292 may be implemented as a bipolar junction transistor (BJT). While a BJT transistor, resistors, diodes, and a capacitor are mentioned, other circuit components may be chosen to meet the design criteria of a particular application.

The stage 150, the stage 152 and the stage 154 may each be implemented in a common emitter configuration. Emitter degeneration may control DC stability with temperature and process variations. The emitter degeneration may also control a transconductance of the stage 104. The isolation of the stage 104 may be determined by a feedback through the diodes 236–240, 266–270 and/or 296–300 or by a transistor collector-base capacitance. The transistor 232, the transistor 262, and the transistor 292 may be configured to minimize collector-base capacitance.

The stage 102 generally acts as a buffer stage providing resistance transformation from a high input resistance for the signal IN to a low output resistance for the signal INT over a wide frequency range. The stage 102 generally provides a stable voltage gain close to unity. However, the stage 102 generally increases the power level of the signal IN. In addition to a beneficial effect on bias stability, the resistors 244, 274 and 304 may, in general, increase the input resistance and output resistance of the stages 150, 152 and 154. The voltage amplification of the stages 150, 152 and 154 may be stabilized by the resistors 244, 274 and 304, respectively. The gain of the stages 150, 152 and 154 may be independent of the respective transistors 232, 262 and 292.

In general, the isolation provided by the output stages 150–154 is determined by a feedback path comprising the collector-base capacitances of the transistors 232, 262 and 292, respectively. By configuring the transistors 232, 262 and 292 to minimize the collector-base capacitance, any feedback of the output signals (e.g., OUT1, OUT2 and OUT3) passing through the capacitance is generally attenuated.

Further attenuation of any feedback signals is generally accomplished by the inherently low output impedance of the emitter-follower configuration of the transistor 204 in the first stage 102. Each of the resistors 230, 260 and 290 form a voltage divider with the resistor 206, which is in parallel with the output impedance of the transistor 204. Because of the output impedance of the emitter-follower configuration is inherently low, the feedback signals are further attenuated. The combination of minimized collector-base capacitance in the stages 150, 152 and 154 and an emitter-follower topology for the stage 102 generally increase the attenuation (e.g., isolation) between the output signals OUT1, OUT2 and OUT3.

The present invention may comprise a multiport amplifier with high isolation between ports. The present invention may provide an improvement in the function compared with conventional circuits. The functional improvement may be achieved while decreasing the cost. In one example, the present invention may have three output amplifier stages for broadband circuit applications, such as a cable television set-top box application. However, any number of output stages may be implemented to meet the design criteria of a particular application. The circuit 100 may be configured to maintain a forward signal gain.

High isolation within an integrated circuit package may be difficult to achieve using conventional designs. The present invention may implement a layout to maximize isolation between ports. The output transistors 232, 262 and 292 may be configured to reduce feedback capacitance and increase output stage isolation. In one example, the present invention may use an active circuit that may provide monodirectional attenuation and gain.

The present invention may be implemented in a low cost package that may be very important as market demands smaller and lower cost components. The present invention may be conducive to monolithic innovation. Assembly costs may be lower as the present invention may reduce or eliminate numerous IC's, PCB space, and external components.

The transistors described herein may be implemented as bipolar junction transistors (BJTs) (or heterojunction bipolar transistors (HBTs)). However, other transistors with similar characteristics may be implemented to meet the design criteria of a particular implementation. In particular, the various transistors of the present invention may be implemented using a variety of process technologies. For example, any or all of Silicon Germanium (SiGe), Indium Gallium Phosphorous (InGaP), Indium Phosphide (InP), or Gallium Arsenide (GaAs) may be used. However, other process technologies may be implemented to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate an intermediate signal in response to an input signal, wherein said first circuit comprises a transistor configured as an emitter follower; and
   a second circuit comprising a plurality of output transistors each configured to generate one of a plurality of output signals in response to said intermediate signal, wherein each of said output signals (i) comprises an amplified version of said input signal and (ii) is isolated from each of said other output signals through a common emitter configuration of each of said output transistors.

2. The apparatus according to claim 1, wherein said emitter follower is configured to generate a low impedance on said intermediate signal.

3. The apparatus according to claim 1, wherein said second circuit is configured to each of said output signals and said input signal.

4. The apparatus according to claim 1, wherein said apparatus is configured to maintain a forward signal gain.

5. The apparatus according to claim 1, wherein said apparatus is configured to increase reverse isolation.

6. The apparatus according to claim 1, wherein said apparatus is configured to minimize collector to base capacitance.

7. The apparatus according to claim 1, wherein said first circuit and said second circuit are coupleable to a supply voltage.

8. The apparatus according to claim 1, wherein said first circuit and said second circuit are coupleable to a ground.

9. The apparatus according to claim 1, wherein one or more resistors are coupled between said first circuit and said second circuit.

10. The apparatus according to claim 1, wherein said second circuit comprises a plurality of stages, each configured to generate one of said output signals.

11. An apparatus comprising:
    means for generating an intermediate signal in response to an input signal, wherein said means for generating said intermediate signal comprises a transistor configured as an emitter follower; and
    means for generating a plurality of output signals in response to said intermediate signal using a plurality of output transistors, wherein (a) each of said output signals (i) comprises an amplified versions of said input signal and (ii) is isolated from each of said other output signals through a common emitter configuration of each of said output transistors.

12. A method for presenting a plurality of outputs in response to an input comprising the steps of:
    (A) generating an intermediate signal in response to said input signal using a transistor configured as an emitter follower; and
    (B) generating said plurality of output signals in response to said intermediate signal using a plurality of output transistors, wherein each of said output signals (i) comprises an amplified versions of said input signal and (ii) is isolated from each of said other output signals through a common emitter configuration of each of said output transistors.

13. The apparatus according to claim 1, wherein each of said output signals has isolation from said input signal.

14. The apparatus according to claim 13, wherein said isolation between said output signals and said input signal is achieved through a low impedance on said intermediate signal of said input circuit and a low impedance of said common emitter configuration of said output circuit.

15. The apparatus according to claim 3, wherein an emitter of each of said output transistors is connected to ground.

* * * * *